United States Patent
Poulson

(10) Patent No.: US 6,960,943 B1
(45) Date of Patent: Nov. 1, 2005

(54) SUPPRESSED MICRO PHONIC PHASE STABLE SYNTHESIZER

(76) Inventor: Kim Alt Poulson, 14421 46th Ave. S., Tukwila, WA (US) 98168

( * ) Notice: Subject to any disclaimer, the term of this patent is extended or adjusted under 35 U.S.C. 154(b) by 0 days.

(21) Appl. No.: 10/456,119

(22) Filed: Jun. 6, 2003

(51) Int. Cl.$^7$ ............................................. H03B 21/00

(52) U.S. Cl. ...................... 327/105; 327/156; 327/147; 331/25

(58) Field of Search ...................... 327/115, 105, 156, 327/113, 141, 147; 331/2, 25

(56) References Cited

U.S. PATENT DOCUMENTS

| | | | | |
|---|---|---|---|---|
| 4,091,232 A | | 5/1978 | Lenk et al. ................. | 174/52.1 |
| 5,038,115 A | * | 8/1991 | Myers et al. .................. | 331/2 |
| 5,153,531 A | | 10/1992 | Fujisaki ........................ | 331/67 |
| 5,414,741 A | | 5/1995 | Johnson ...................... | 375/376 |
| 5,675,620 A | * | 10/1997 | Chen .......................... | 375/376 |
| 5,963,098 A | | 10/1999 | MacMullen et al. ........ | 331/1 R |
| 6,067,503 A | | 5/2000 | Yakos ......................... | 701/213 |

FOREIGN PATENT DOCUMENTS

JP          0016779      *  1/1997

\* cited by examiner

*Primary Examiner*—Dinh T. Le

(57) ABSTRACT

A method and apparatus for frequency and phase error compensation in a synthesized oscillator is presented. A plurality of synthesizers (10, 20, N0) are connected in parallel and coherently combined. Each synthesizer employs a commonly referenced (42) feedback loop controlled oscillating source (12, 22, N2). Each synthesizer utilizes a phase shift detector (14, 24, N4) and in the path of each synthesizer is a time delay (16, 26, N6). The output of each synthesizer is modified by an amplitude control device (18, 28, N8). The plurality of synthesizers is coherently combined (40) at the output. When an internal or external physical event causes a phase or frequency error at the output of the oscillator, the phase and/or frequency error is detected by the phase shift detector. The phase shift detector disables the output of the synthesizer thereby preventing the phase and/or frequency error from propagating to the output of the circuit. This results in an improvement in phase noise density and reduces the probability of rapid phase and/or frequency change in the combined output.

3 Claims, 5 Drawing Sheets

Pularity of Synthesizers

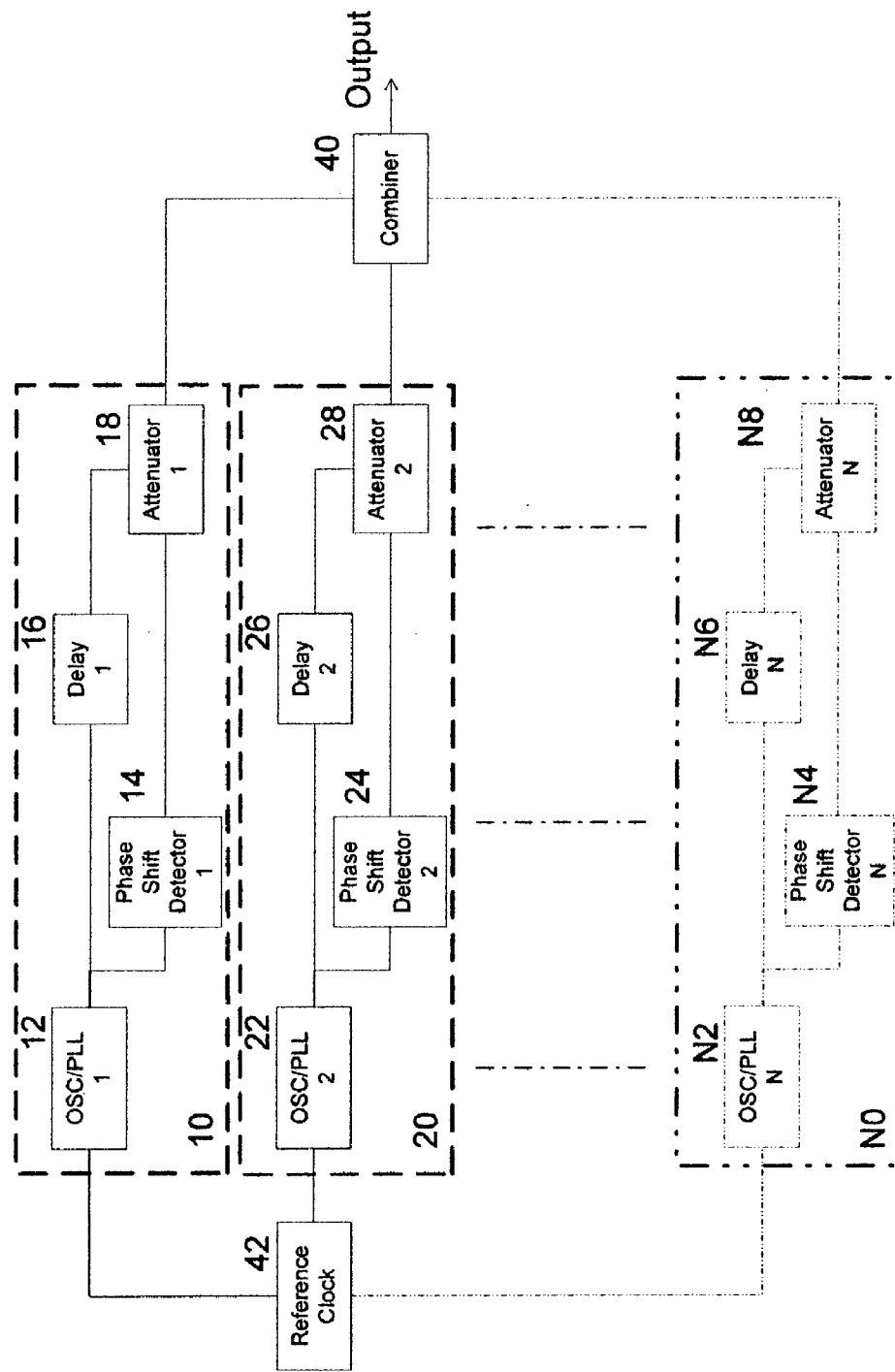
Fig 1. Pularity of Synthesizers

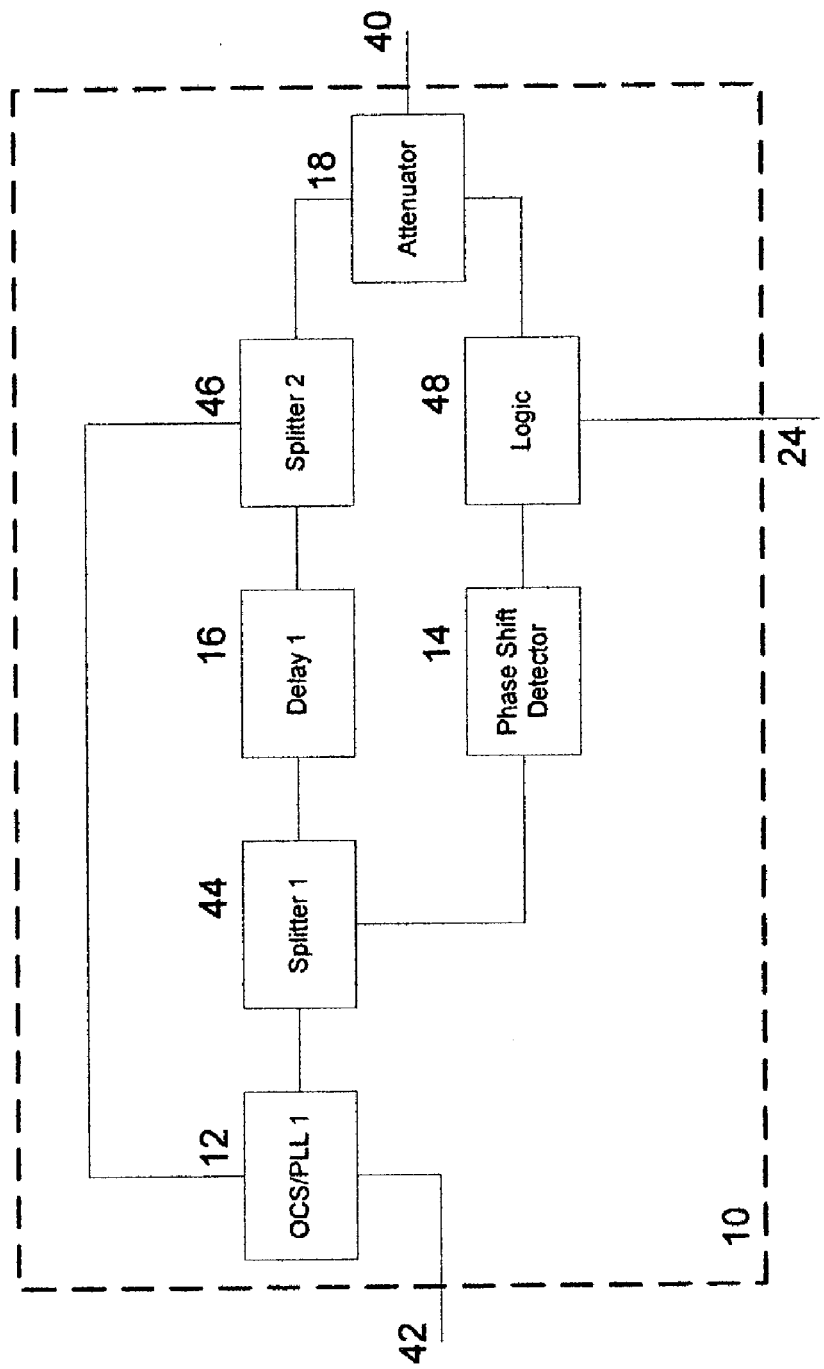
Fig 2. Synthesizer Embodiment

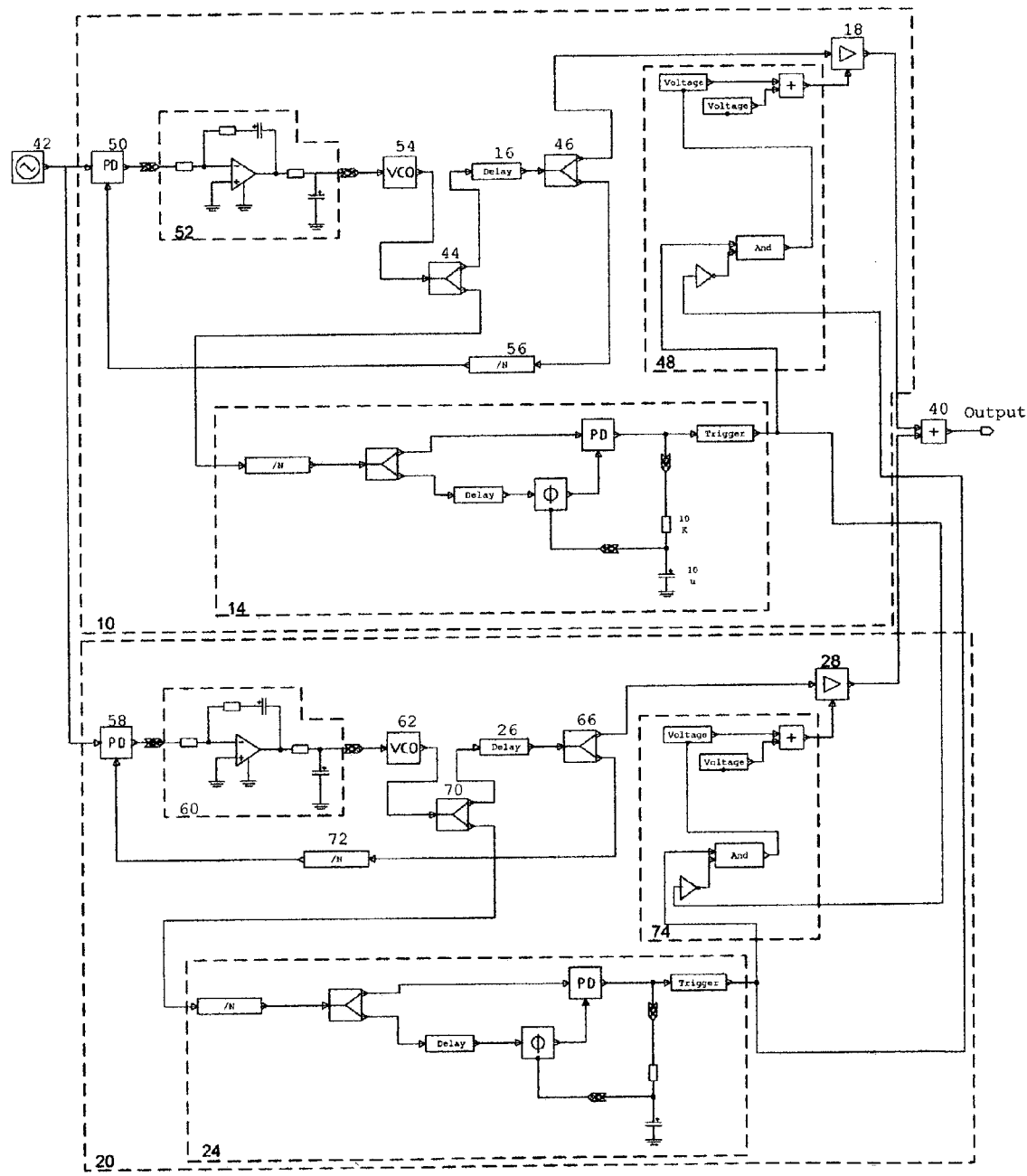
Fig 3. Invention Embodiment

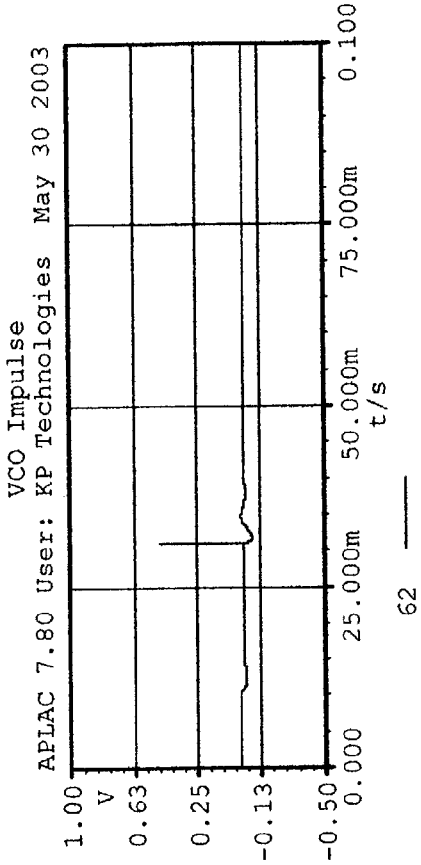
Fig 4a VCO Control Voltage
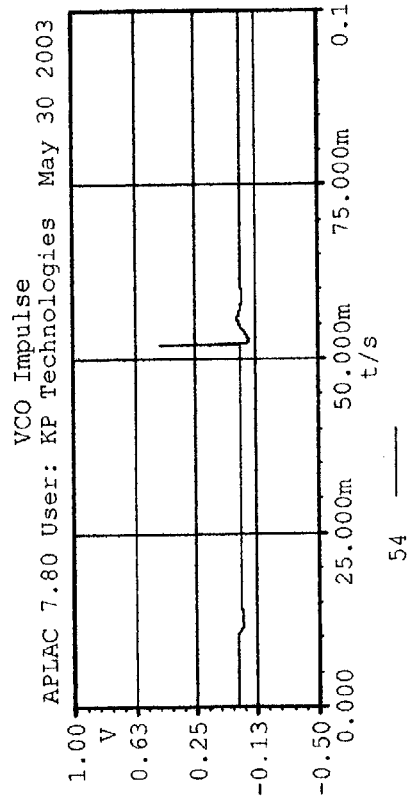
Fig 4b Phase Detector Output
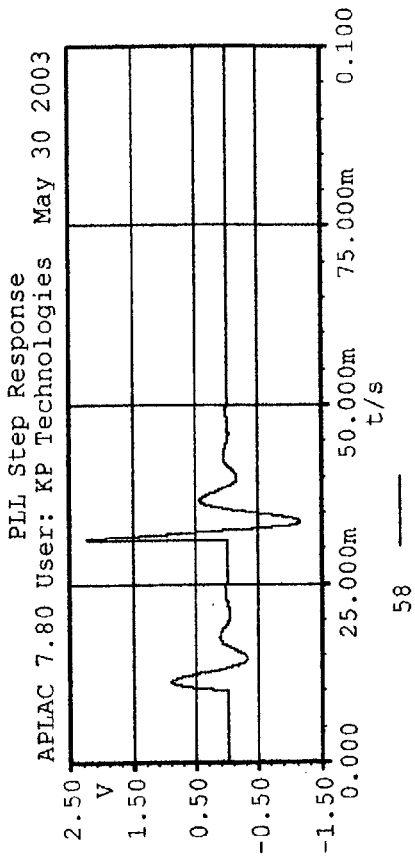
Fig 4c VCO Control Voltage
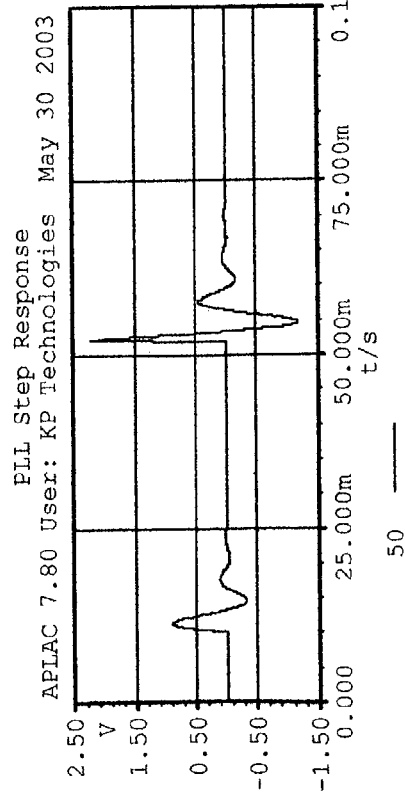
Fig 4d Phase Detector Output

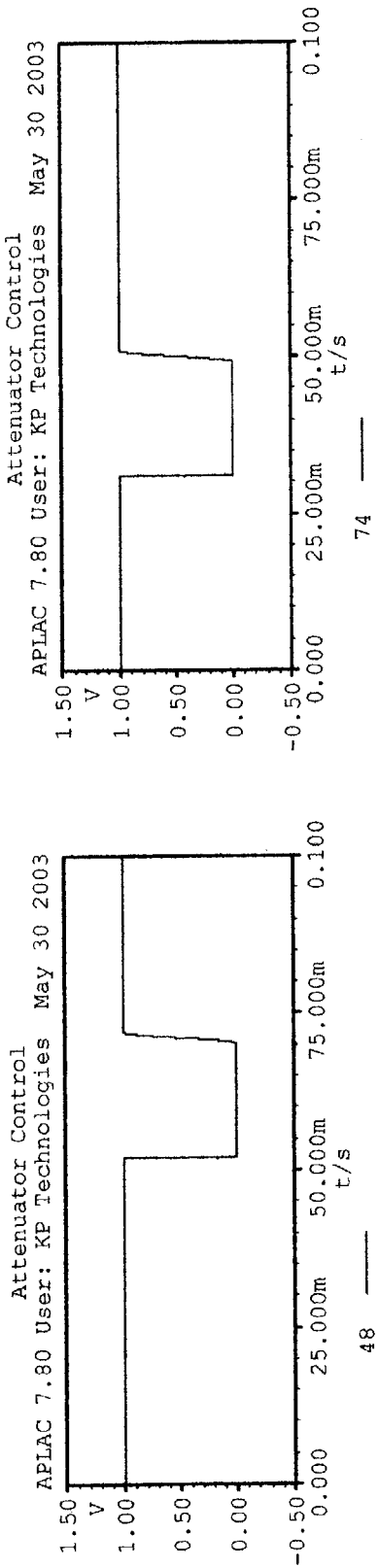
Fig 5a. Logic Control Output
Fig 5b. Logic Control Output
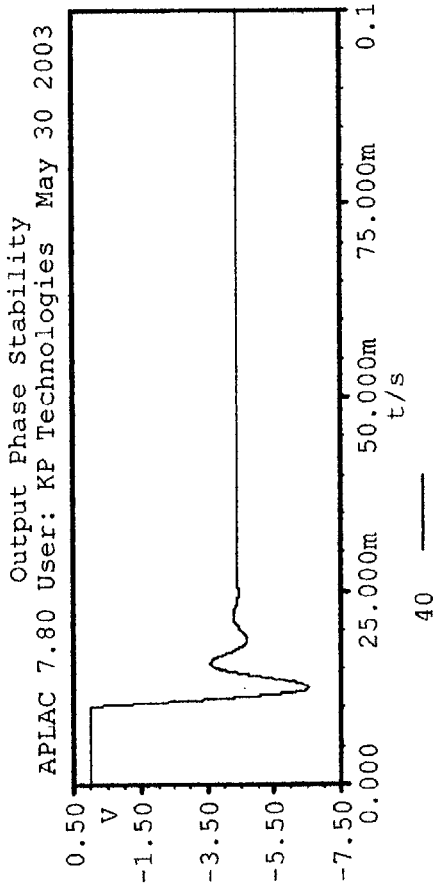
Fig 5c. System Output

SUPPRESSED MICRO PHONIC PHASE STABLE SYNTHESIZER

CROSS-REFERENCE TO RELATED APPLICATIONS

Not Applicable

FEDERALLY SPONSORED RESEARCH

Not Applicable

SEQUENCE LISTING OR PROGRAM

Not Applicable

BACKGROUND OF INVENTION—FIELD OF INVENTION

This invention relates to the synthesized signal sources, specifically to such sources that are used in high capacity microwave communication equipment.

BACKGROUND OF INVENTION

Radio Frequency (RF) circuits such as transmitters and receivers require oscillators that synthesize desired frequencies and are in synchronization with a reference clock. Generally the oscillator output frequency is a multiple of the reference clock, and operates at much higher frequencies. In modern digital communications equipment the transmitter and receiver utilize local oscillators for converting RF signals to higher and lower frequencies. The transmitters and receivers must operate with very low overall bit error rates. To achieve low bit error rates it is essential that the local oscillator have very low spectral noise density and have immunity to physically induced noise such as noise induced by thermal cycling, mechanical vibration and shock. Noise created by such physical events is also known as micro phonic noise. The term micro phonic as used throughout this document refers to a rapid frequency or phase change from an oscillator output that is under feed back loop control. Micro phonic noise can be introduced in many ways; however, the most common is a physical disturbance from sources external to the affected circuits such as hail falling on a radio enclosure or internal sources such as that caused by differing thermal expansion coefficients of semiconductor dice, bond wires, packaging materials, etc. Micro phonic disturbances can be catastrophic for radio operation because these disturbances cause very large bursts of bit errors and loss of synchronization in all parts of the radio including the Phase Locked Loops (PLL), clock recovery circuits, data recovery circuits, etc. Micro phonic noise generally ranges in the frequency of tens of hertz to hundreds of kilohertz. Any disturbance that falls within the loop bandwidth of the PLL will be compensated by the PLL, greatly attenuating the disturbance and in most cases preventing the disturbance from propagating to the output of the PLL. Hence, micro phonic noise within the loop bandwidth of the PLL will not cause bit errors in the transmission system. Micro phonic noise falling in a frequency range above the loop bandwidth of the PLL will not be tracked by the PLL and the noise will appear on the output of the PLL. Hence, micro phonic noise outside the loop bandwidth of the PLL will cause bit errors in the transmission system, the severity of the errors being commensurate with the severity of the noise.

In the current state of the art the micro phonic susceptibility issue is addressed in general by increasing the loop bandwidth of the local oscillator PLL. Increasing the loop bandwidth of the PLL increases the immunity to micro phonic noise by allowing the PLL to compensate for all noise falling within the loop bandwidth of the PLL. A significant disadvantage of increasing the loop bandwidth of the PLL is an increase in spectral noise density on the output of the PLL. This increase in noise associated with increased bandwidth may add to the noise floor of the transmission system and hence increase the error floor of the transmission system. This imposes a practical limit to the maximum loop bandwidth of the PLL, which often is insufficient to eliminate errors due to micro phonics in the transmission system. Moreover, as modern digital communication systems become more spectrally efficient, system noise floor specifications require reduced PLL bandwidths. The persisting need for a system providing micro phonic immunity concomitant with an acceptable PLL bandwidth, the prior art has heretofore not resolved such disadvantages and problems.

Also in the art, techniques are employed to mechanically isolate the sensitive control elements of the oscillator from external mechanical vibrations and thermal variations. Mechanical isolation techniques have not proven to be reliable or effective in eliminating the error sources to which micro phonics are attributed. Additionally, this process is prone to error in manufacturing and the formula for success can be difficult to reliably repeat in a mass production environment. Again, the prior art has not satisfactorily resolved the micro phonic issue.

BACKGROUND OF INVENTION—OBJECTS AND ADVANTAGES

The current invention addresses the unresolved problem with phase instability due to micro phonic events aforementioned. In addition, the associated objects and advantages of the current invention are;
(a) to provide robust micro phonic suppression method and apparatus for microwave synthesizers;
(b) apparatus to sustain phase integrity without negatively impacting spectral phase noise density; and
(c) apparatus that is amenable to mass production techniques, not relying on special mechanical formulas.

SUMMARY OF THE INVENTION

The apparatus and system of the present invention addresses the aforementioned disadvantages of preexisting communications equipment relating to micro phonic errors and spectral noise density improvement. The present invention substantially improves a synthesized oscillator output by utilizing a plurality of coherent synthesizers in parallel. Each synthesizer utilizes a PLL controlled oscillator, connected to a phase shift detector with each PLL having in its path a delay line. According to this invention, at least two synthesizer circuits are connected in parallel through a series of phase detectors, power dividers, delay lines, attenuators, logic circuits and power combiners. The output of each PLL controlled oscillator is split into 2 separate paths through a first power divider. One output of the first power divider runs to a phase shift detector. The output of the phase shift detector drives the control line of an attenuator. The second output of the first power divider runs to a delay line. The output of the delay line drives a second power divider. The first output of the second power divider is the feedback path of the PLL. The second output of the second power divider runs to the input of the attenuator, which is controlled by the phase shift detector. The output of the attenuator runs to the input of a power combiner. The output of the power combiner is the system output. The phase shift detector monitors the output of the PLL controlled oscillator. When a phase or frequency disturbance is detected by the phase shift detector, the phase shift detector sends a signal to the attenuator to set the attenuator at maximum attenuation. This prevents the synthesizer output signal from reaching the system output. The delay line that is in the path between the PLL controlled oscillator and the system output compensates for the response time of the phase shift detector, logic and attenuator circuits.

DRAWINGS—FIGURES

In the drawings, closely related figures have the same number but different alphanumeric suffixes.

FIG. 1 is a simplified block diagram of the system showing the major components;

FIG. 2 is a more detailed block diagram of the synthesizer;

FIG. 3 is a general schematic of the system showing one embodiment of the invention using two PLL circuits in parallel.

FIG. 4*a* is a graph of the VCO control voltage to 54, that aids in understanding the system schematic shown in FIG. 3

FIG. 4*b* is a graph of the phase detector control voltage output from 50, that aids in understanding the system schematic shown in FIG. 3

FIG. 4*c* is a graph of the VCO control voltage to 62, that aids in understanding the system schematic shown in FIG. 3

FIG. 4*d* is a graph of the phase detector control voltage output from 58, that aids in understanding the system schematic shown in FIG. 3

FIG. 5*a* is a graph of the attenuator control voltage from 48, that aids in understanding the system schematic shown in FIG. 3

FIG. 5*b* is a graph of the attenuator control voltage from 74, that aids in understanding the system schematic shown in FIG. 3

FIG. 5*c* is a graph showing the phase stable output voltage from 40, that aids in understanding the system schematic shown in FIG. 3

DETAILED DESCRIPTION OF THE INVENTION

| DRAWINGS - Reference Numerals | |
|---|---|
| 10 ,20 & N0 | Synthesizers |
| 12, 22 & N2 | Feed Back Controlled Oscillators |
| 14, 24 & N4 | Phase Shift Detectors |
| 16, 26 & N6 | Time Delay Elements |
| 18, 28 & N8 | Amplitude Attenuators |
| 40 | Synthesizer Output Signal Combiner |
| 42 | Common Reference Clock |
| 44, 46, 66 & 70 | Signal Splitters |
| 48 & 74 | Logic Control Circuits |
| 50 & 58 | Signal Phase Detector Circuits |
| 52 & 60 | PLL Filter Circuits |
| 54 & 62 | Voltage Controlled Oscillator |
| 56 & 72 | Frequency Dividers |

FIG. 1 is a block diagram of a plurality of synthesizer circuits 10, 20, N0 each circuit having a PLL in accordance with the prior art. The synthesizer of the present invention may include a voltage controlled, yttrium iron garnet, dielectric resonator or other oscillator under feed back control. Each synthesizer operates at the same frequency as all other synthesizers. The OSC/PLLs 12, 22, N2 are each coupled to a common reference clock 42. The PLLs synthesize a desired oscillating frequency which is a multiple of the reference clock. The PLL controlled oscillator output is coupled to a phase shift detector circuit 14, 24, N4 and to a delay 16, 26, N6. The phase shift detector of the present invention may include a delay line discriminator, a multiplier, a digital phase detector or other similar device to measure phase or frequency offset. Any variation in phase or frequency from the output of the PLL controlled oscillator will be detected by the phase shift detector circuit. The delay element 16, 26, N6 of the present invention may include a delay line, delay filter, or other time delay method known to persons skilled in the art. The output of the delay line is connected to the input of an attenuator circuit 18, 28, N8. The attenuator of the present invention may include a FET attenuator, a transistor attenuator, a pin diode attenuator and other similar types of attenuators well known to persons skilled in the art. The outputs of the attenuators are connected to the input of a power combiner 40. The output of the power combiner is the system output. When the system is in steady state the output of all synthesizer circuits are enabled and power combined at the power combiner output. All synthesizer output signals are required to be frequency coherent and nondestructive in phase relationship at the power combiner input.

A micro phonic event which perturbs any synthesizer will cause a variation of signal phase and/or frequency on the output of the PLL controlled oscillator. This signal will simultaneously enter the phase shift detector and the delay line. The phase detector will detect the variation in phase and will send a control signal to the attenuator corresponding to maximum attenuation. The delay time of the delay line circuit is chosen such that the propagation of the PLL controlled oscillator output signal through the delay line is longer than the response time of the phase shift detector and attenuator circuits. Hence, the attenuator will disable the output of the synthesizer signal before the disturbance is allowed to reach the output of the system.

A minimum of two synthesizer circuits 10, 20 are connected in parallel. A disturbance which affects one of the synthesizer circuits will not propagate to the output of the system. Due to variations in manufacturing each synthesizer responds to environmental conditions in a different manner. Micro phonic responses of each synthesizer will vary to some extent. Thereby, putting two synthesizer circuits in parallel reduces the susceptibility of the system to micro phonic events. Adding more synthesizer circuits in parallel will further reduce the susceptibility of the system to micro phonic events. Additionally, the plurality of coherent signals combined at the output, will increase the spectral power of the synthesized signal. However, the spectral noise of the synthesizers is incoherent and thus the relative spectral noise density will be reduced at the output.

FIG. 2 is a block diagram showing more detail of one embodiment for the individual synthesizer circuit. The power splitters 44 and 46 provide buffered signal path splitting. The length of the time delay of 16 must exceed; the phase shift detector 14, logic 48, and attenuator 18 response times. Logic 48 enables a decision process based on the phase stability output of 14 and the control state from the phase shift detector of other synthesizer circuits.

FIG. 3 is a detailed schematic diagram of one embodiment of the system showing two synthesizer circuits in parallel 10, 20. Synthesizer 10 receives a reference clock signal from 42. The phase detector 50 and loop filter 52 generate a voltage which drives the VCO 54 to the desired frequency, (frequency=reference*N, where N is the frequency divider 56 in the feedback path of the PLL). The specifics of PLL implementation and frequency divider circuits are well known to persons skilled in the art. The output of the VCO drives a power splitter 44. The outputs of the power splitter connect to the phase shift detector 14 and the delay line 16. The delay line 16 drives a signal splitter 46. One of the signal splitter outputs drives the PLL frequency divider 56. Also, 16 and 46 are inside the feedback loop for the PLL to maintain phase coherence between all PLLs over time and temperature. The other output from the signal splitter drives the signal input to a voltage variable attenuator 18. The phase shift detector 14 provides a logic output corresponding to normal or error state to the decision logic 48. The decision logic 48 controls the voltage variable attenuator based on the state of 14 and 24. The output from the voltage variable attenuator 18 is combined with the output from 28 in 40. Synthesizer 20 is a functional replication of synthesizer 10. Of importance is the output from 14 to the decision logic 74 and the output from 24 to the decision logic 48. These allow each synthesizer to monitor the phase stability of the other so that both synthesizers can not be simultaneously attenuated.

FIG. 4 is a graph of the VCO control voltages to 54 and 62 and the PLL phase detector outputs from 50 and 58, showing the response of these circuits to an impulse or disturbance, at different times.

FIG. 5 is a graph of the input control voltages to the attenuator 18, 28 and detector voltage showing the system phase stability at the power combiner 40 versus time. An impulse noise is applied to the VCO's as shown in FIG. 4. As can be seen in FIG. 5c, the system has completely removed the errors generated by the impulse injected at the VCO's.

CONCLUSIONS, RAMIFICATIONS, AND SCOPE

Accordingly the reader will see that the phase stable synthesizer of this invention can be used to effectively eliminate phase instabilities that arise from external events. Moreover, the apparatus and methods given do not require adjustment of the synthesizer feed back loop bandwidth. Thereby, allowing spectral noise density performance optimization without increasing susceptibility to micro phonic induced phase instabilities. Furthermore, the coherent combining of multiple synthesizers improves phase noise spectral density of the combined output. Consequently as micro phonic suppression is achieved through signal process and control, expensive mechanical manufacturing process are not required.

Although the description above contains much specificity, these should not be construed as limiting the scope of the invention but as merely providing illustrations of some of the presently preferred embodiments of this invention.

Thus the scope of the present invention should be determined by the appended claims and their legal equivalents, rather than by the examples given.

What is claimed is:

1. An apparatus for compensating phase and frequency error of an output signal comprising:
   (a) a plurality of synthesized frequency sources coupled to receive a common reference clock; each said synthesized frequency source having a having a loop locked oscillator coupled to
   (b) receive said common reference clock, a delay element coupled to a first output of the loop locked oscillator, a signal error detector coupled to a second output which is
   (c) split from the from the first output of the loop locked oscillator, and an amplitude controlling device coupled to said delay element to generate a controlled signal responsive to a
   (d) detecting signal from said signal error detector; and
   (e) an output circuit coupled to combine the controlled signals from the amplitude controlling devices to provide the output signal being stable in frequency or the phase.

2. A method for compensating phase and frequency error of an output signal, the method comprising steps of:
   (a) providing a common reference clock for a plurality of synthesized frequency sources; wherein each synthesized frequency source having a loop locked oscillator
   (b) coupled to receive said common reference clock, a delay element coupled to a first output of the loop locked oscillator, a signal error detector coupled to a second output
   (c) which is split from the first output of the loop locked oscillator, and an amplitude controlling device coupled to said delay element to generate a controlled signal
   (d) responsive to a detecting signal from said signal error detector; and
   (e) combining said controlled signals from the amplitude controlling devices to provide said output signal being stable in the frequency and/or phase.

3. A method for compensating phase and frequency error of an output signal, the method comprising the steps of:
   (a) generating a plurality of said synthesized signals from a common reference clock;
   (b) delaying each synthesized signal in a first path;
   (c) detecting a phase shift of said each synthesized signal to provide a detecting signal in a second path;
   (d) adjusting the amplitude of each delayed synthesized signal using said each detecting signal;
   (e) combining said adjusted signals to provide said output signal being stable in the frequency and phase.

* * * * *